United States Patent
Saether

(10) Patent No.: US 7,443,260 B2
(45) Date of Patent: Oct. 28, 2008

(54) LOW-POWER OSCILLATOR

(75) Inventor: Terje Saether, Trondheim (NO)

(73) Assignee: ATMEL Corporation, San Jose, CA (US)

( * ) Notice: Subject to any disclaimer, the term of this patent is extended or adjusted under 35 U.S.C. 154(b) by 113 days.

(21) Appl. No.: 11/523,463

(22) Filed: Sep. 19, 2006

(65) Prior Publication Data

US 2008/0129404 A1 Jun. 5, 2008

(51) Int. Cl.
*H03L 7/099* (2006.01)
(52) U.S. Cl. .................... 331/185; 331/177 R
(58) Field of Classification Search ............... 331/111, 331/143, 145, 150, 153, 185, 186; 323/242, 323/265, 271, 282, 288
See application file for complete search history.

(56) References Cited

U.S. PATENT DOCUMENTS

| | | | |
|---|---|---|---|
| 5,986,514 A | | 11/1999 | Salvi et al. |
| 6,005,449 A | * | 12/1999 | Oberlin ................. 331/140 |
| 6,262,610 B1 | | 7/2001 | Lo et al. |
| 6,606,008 B2 | | 8/2003 | Traub |
| 6,765,448 B2 | | 7/2004 | Wu et al. |
| 6,788,161 B2 | * | 9/2004 | Vilander ................. 331/185 |
| 2004/0090281 A1 | | 5/2004 | Ari |

FOREIGN PATENT DOCUMENTS

| | | |
|---|---|---|
| EP | 1 843 170 | 10/2007 |
| GB | 2 005 944 | 4/1979 |
| WO | WO2003/088473 | 10/2003 |
| WO | WO2006/080454 | 8/2006 |

OTHER PUBLICATIONS

Klumperink, E. et al. "Reducing MOSFET 1/F Noise and Power Consumption by Switched Biasing" IEEE Journal of Solid-State Circuits, IEEE Service Center, Piscataway, NJ, US, vol. 35, No. 7, Jul. 2000 pp. 994-1001.

* cited by examiner

*Primary Examiner*—Robert Pascal
*Assistant Examiner*—Ryan J. Johnson
(74) *Attorney, Agent, or Firm*—Fish & Richardson P.C.

(57) ABSTRACT

A circuit can include an oscillator core that outputs, in response to a bias signal, a periodic signal having an oscillation frequency; a bias circuit that, when powered, provides the bias signal (e.g., a voltage) to the oscillator core; and a switching circuit that periodically powers the bias circuit at a second frequency and provides the bias signal to the oscillator core when the bias circuit is not powered. The switching circuit can include a storage element that stores energy when the bias circuit is powered and uses stored energy to provide the bias signal when the bias circuit is not powered. The switching circuit can include a divider circuit that divides the oscillation frequency of the periodic signal to generate a control signal having the second frequency, and the bias circuit can be periodically powered at the second frequency in response to the control signal.

17 Claims, 5 Drawing Sheets

LOW-POWER OSCILLATOR

TECHNICAL FIELD

The disclosed implementations relate to electrical circuits.

BACKGROUND

Many electrical circuits employ oscillators to generate periodic signals (e.g., clock signals) for use in synchronizing various portions of the circuits or for other timing purposes. In circuits where power consumption is a concern, oscillators can be turned off during periods in which the corresponding clock signals are not needed (e.g., when circuit portions to which the clock signals are connected are inactive), and other portions of the circuit can be either turned off or transitioned to reduced-power modes (e.g., sleep modes). Once turned off or transitioned to a reduced-power mode, a circuit may not be able to respond to external events in the same manner as the circuit responds when it is in a fully powered mode. As such, it can be advantageous to periodically "wake up" the circuit portions that have been turned off or transitioned to reduced-power modes, in order, for example, to allow the circuit portions to appropriately respond to external events that may have occurred while the circuit portions were off or in reduced-power modes. To enable the circuit portions to be periodically woken up, a circuit can include a second oscillator that, in some implementations, is always running (e.g., a sleep clock).

In some conventional applications, a second oscillator can be included in a circuit for purposes other than waking up circuit portions. For example, a watchdog timer can be included in a circuit to detect if portions of the circuit are not properly functioning. In particular, some watchdog timers count to a predetermined terminal value and are regularly reset by circuit portions that the watchdog timer is protecting. During normal operation, the protected circuit portions periodically restart the watchdog timer such that the watchdog timer never reaches its terminal value. If the protected circuit portions stop functioning properly, the watchdog timer may not be restarted before reaching its terminal value, and reaching the terminal value can cause the watchdog timer to initiate corrective action. For example, some conventional circuits include a microcontroller that executes programming code. To protect the circuits from bugs that may otherwise lock up the microcontroller, a watchdog timer can be included that resets the microcontroller upon reaching a terminal value. During normal operation, the microcontroller can be programmed to periodically restart the watchdog timer at an interval that will prevent the watchdog timer from reaching its terminal value. If the microcontroller locks up, for example, because of an illegal instruction or a bad branch, the microcontroller will not restart the watchdog timer before the watchdog timer reaches its terminal value, and the watchdog timer can initiate a reset of the microcontroller (or other corrective action) to free the microcontroller from its locked-up condition.

SUMMARY

An oscillator circuit can include an oscillator core that outputs, in response to a bias signal, a periodic signal having an oscillation frequency. The oscillator circuit can also include a bias circuit that, when powered, provides the bias signal to the oscillator core, The oscillator circuit can also include a switching circuit that periodically powers the bias circuit at a second frequency and provides the bias signal to the oscillator core when the bias circuit is not powered. By only periodically powering the bias circuit, the oscillator circuit may consume less power than other oscillator circuits that more frequently or continuously power a corresponding bias circuit.

In some implementations, a circuit includes an oscillator core that outputs, in response to a bias signal, a periodic signal having an oscillation frequency; a bias circuit that, when powered, provides the bias signal to the oscillator core; and a switching circuit that periodically powers the bias circuit at a second frequency and provides the bias signal to the oscillator core when the bias circuit is not powered.

The bias signal can be a voltage. The switching circuit can include a storage element that stores energy when the bias circuit is powered and uses stored energy to provide the bias signal when the bias circuit is not powered. The circuit can further include a charging circuit that stores energy in the storage element when the bias circuit is powered. The circuit can further include a sample-and-hold circuit, and the storage element can be included in the sample-and-hold circuit. The switching circuit can further include a divider circuit that divides the oscillation frequency of the periodic signal to generate a control signal having the second frequency, and the bias circuit can be periodically powered at the second frequency in response to the control signal. The second frequency can be an integer fraction of the oscillation frequency. The switching circuit can periodically disconnect power to at least a portion of the bias circuit in response to the control signal. A portion of the bias circuit and a portion of the oscillator core can be configured as a current mirror.

In some implementations, a method can include in a first mode, using a first source to provide a bias signal to an oscillator circuit to generate a periodic signal having an oscillation frequency; in a second mode, using a second different source to provide the bias signal to the oscillator circuit to generate the periodic signal having the oscillation frequency; and switching between the first mode and the second mode at a switching frequency that is related to the oscillator frequency.

The first source can be a bias circuit. The second different source can be a storage circuit. The switching frequency can be an integer fraction of the oscillation frequency. The method can further include dividing the oscillation frequency of the periodic signal to generate a signal having the switching frequency. The method can further include disconnecting power to at least a portion of the bias circuit during the second mode. The method can further include charging the storage circuit during the first mode.

In some implementations, a circuit includes an oscillator core that generates a periodic signal having an oscillation frequency in response to a voltage bias; and a bias circuit that provides the voltage bias. The bias circuit can include an active bias portion and a passive bias portion that are alternatively activated. The active bias portion can include a circuit that draws power from a power supply to provide the voltage bias. The passive bias portion can include a storage element that stores power when the active bias portion is activated and provides the voltage bias when the passive bias portion is activated.

The circuit can further include a switching circuit that alternatively activates the active bias portion and the passive bias portion. The switching circuit can use a control signal having a switching frequency that is related to the oscillation frequency to alternatively activate the active bias portion and the passive bias portion. In some implementations, the switching frequency is an integer fraction of the oscillation frequency. The circuit can further include a divider circuit that divides the oscillation frequency of the periodic signal by an integer to generate the control signal having the switching frequency. In some implementations, the active bias portion draws less power from the power supply when the passive bias portion is activated than when the active bias portion is activated.

The details of one or more implementations are set forth in the accompanying drawings and the description below. Other features, objects, and advantages will be apparent from the description and drawings, and from the claims.

DESCRIPTION OF DRAWINGS

Like reference symbols in the various drawings indicate like elements.

DETAILED DESCRIPTION

Figure 1A:
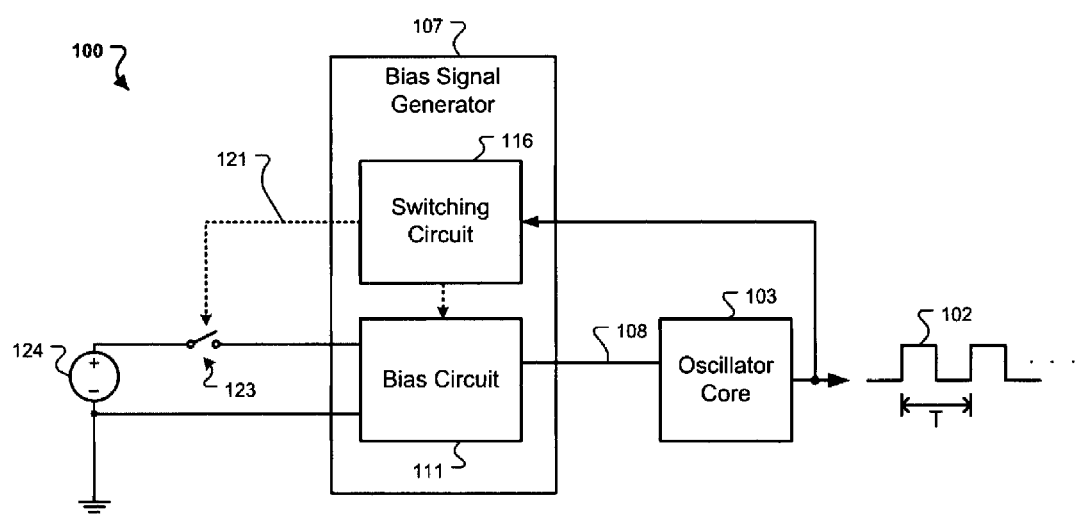
FIG. 1A is a block diagram of an exemplary circuit that can generate a periodic signal.

FIG. 1A is a block diagram of an exemplary circuit 100 that can generate a periodic signal 102 having an oscillation frequency (e.g., a frequency of 1/T). In one implementation, as shown, the circuit 100 includes an oscillator core 103 and a bias signal generator 107, and the bias signal generator includes a bias circuit 111 and a switching circuit 116. The oscillator core 103 can generate the periodic signal 102 with a frequency based on a bias signal 108 (e.g., a voltage) provided by the bias signal generator 107.

Figure 1B:
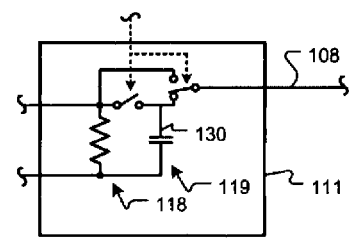
FIG. 1B provides additional exemplary details of the circuit shown in FIG. 1A.

In some implementations, the bias signal generator 107 includes an active portion 118 (e.g., a portion that draws current; see FIG. 1B) and a passive portion 119 (e.g., a portion that, in one mode, does not draw current) that can be alternatively activated. In one implementation, the bias circuit 111 can be alternatively powered and unpowered. The active portion 118 of the bias signal generator 107 can provide the bias signal 108 when the bias circuit 111 is powered, and the passive portion 119 of the bias signal generator 107 can provide the bias signal 108 when the bias circuit 111 is not powered. (As shown in FIG. 1B, the passive portion 119 is activated.) To provide the bias signal 108 when the bias circuit 111 is not powered, the passive portion 119 can include a storage element 130 (e.g., a capacitor) that can be charged when the bias circuit 111 is powered. In some implementations, the bias circuit 111 provides more than one bias signal to the oscillator core 103.

To periodically power the bias circuit, the circuit 100 can employ a switching circuit 116. In some implementations, the switching circuit 116 can generate a control signal 121 to alternatively open and close a switch 123 to either disconnect or connect the bias circuit 111 to a power supply 124. In some implementations, the control signal 121 has a frequency that is related to the frequency of the periodic signal 102. In particular, the switching circuit 116 can include a frequency divider (not shown in FIG. 1) that provides the control signal 121 at, for example, an integer fraction of the frequency of the periodic signal 102. By only periodically powering the bias circuit 111, power consumption of the circuit 100 can be reduced.

Figure 2:
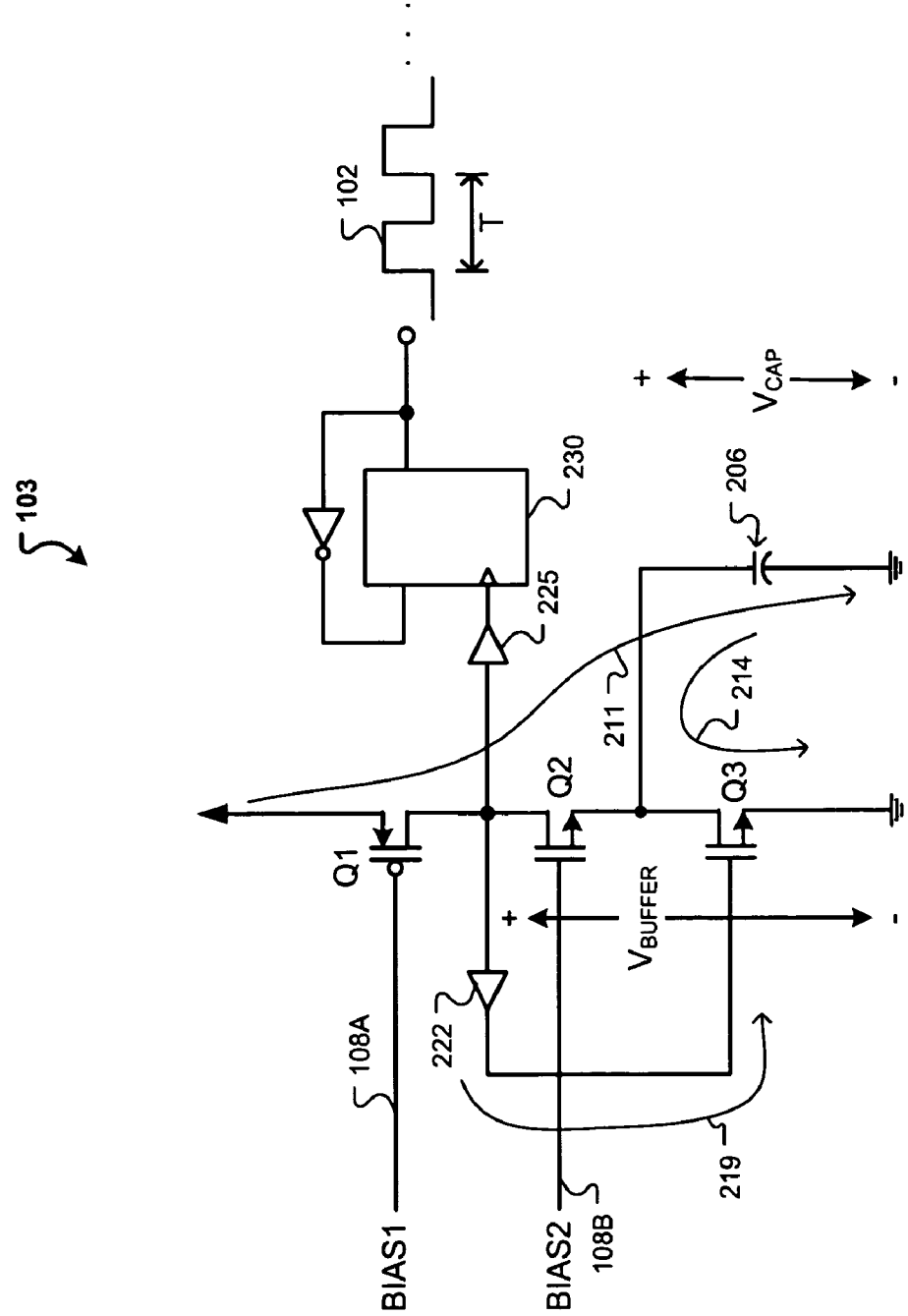
FIG. 2 is a schematic diagram of an exemplary oscillator core that can be included in the circuit shown in FIG. 1.

FIG. 2 is a schematic diagram of an exemplary oscillator core 103. The oscillator core 103 outputs, in response to bias signals 108A and 108B, the periodic signal 102 having an oscillation frequency (e.g., an oscillation frequency of 1/T). In one implementation, as shown, the oscillator core 103 generates the periodic signal 102 by alternatively charging and discharging a capacitor 206. As is described in greater detail below, the oscillator core 103 charges the capacitor 206 through a charging path 211 that can include a current source (e.g., transistors Q1 and Q2), and the oscillator core 103 discharges the capacitor 206 through a discharging path 214 that can include a current sink (e.g., transistor Q3).

To alternatively charge and discharge the capacitor 206, the oscillator core 103 can initially activate the charging path 211 to charge the capacitor 206, causing the voltage $V_{CAP}$ signal to increase. (Exemplary voltage-time diagrams showing the voltage $V_{CAP}$ signal and other signals are provided in and described with reference to FIG. 3A-3D.) When the voltage $V_{CAP}$ signal reaches a predetermined level, the oscillator core 103 can employ a feedback loop 219 to activate the discharging path 214. In particular, in the implementation shown, the increase in the voltage $V_{CAP}$ signal causes a corresponding increase in a voltage $V_{BUFFER}$ signal at an input to a buffer 222 in the feedback loop 219, which can cause a state change in the buffer 222. The state change in the buffer 222 can turn on the transistor Q3, activating the discharging path 214.

In one implementation, when the voltage $V_{CAP}$ signal is very low, the voltage $V_{BUFFER}$ signal is lower than an input high threshold ($V_{IH}$) of the buffer 222, causing the buffer 222 have a logic low output, which causes Q3 to be in a cutoff state (i.e., off). As the voltage $V_{BUFFER}$ signal increases with the voltage $V_{CAP}$ signal, the input high threshold $V_{IH}$ of the buffer is exceeded, causing the buffer 222 to switch states to a logic high output. This change in state of the buffer 222 to a logic high turns on the transistor Q3, activating the discharging path 214 to discharge the capacitor 206. Discharging the capacitor 206 causes the voltage $V_{CAP}$ signal to decrease; and the voltage $V_{BUFFER}$ signal correspondingly decreases (e.g., below the input high threshold $V_{IH}$ of the buffer) causing the buffer to return to having a logic low output. This change in state back to a logic low causes the transistor Q3 to be turned off, which in turn deactivates the discharging path 214. Once the discharging path 214 is deactivated, the capacitor 206 is again charged through the charging path 211, and the process repeats itself.

In one implementation, as shown, the periodic signal 102 of the oscillator core 103 is derived from the voltage $V_{BUFFER}$ signal. In particular, as shown, an additional buffer 225 and a flip-flop 230 can be included to shape the periodic signal 102 into, for example, a substantially square wave. In other implementations, the periodic signal 102 can be derived from other voltages (e.g., the voltage $V_{CAP}$ signal on the capacitor 206), and the periodic signal 102 can have other forms (e.g., a triangle wave, a sine wave, or square waves with varying duty cycles, etc.). Moreover, devices other than the buffer 225 and flip-flop 230 can provide the periodic signal 102. For example, a counter could be used to provide the periodic signal 102, as well as other sampling circuits that can store a threshold level and evaluate a signal relative to the stored threshold level.

The bias signals 108A and 108B can be selected to have voltages that are suitable for operating the oscillator core 103 in the manner described above. In some implementations, the bias signals 108A and 108B are selected to be as low as possible (e.g., to minimize power consumption) while still properly biasing the oscillator core 103. For example, the bias signal 108B can be set to just above the voltage needed to turn on transistor Q2, and the bias signal 108A can be set between the voltage of the bias signal 108B and a voltage that is sufficiently below the voltage of the positive power supply (the supply shown in FIG. 2 that is coupled to the source of transistor Q1) to turn on transistor Q1. In some implementations, the bias signals 108A and 108B are selected based on process parameters of the transistors Q1 and Q2. For example, the bias signal 108A can be selected relative to a threshold voltage of the transistor Q1 in order to maintain transistor Q1 in a saturation mode of operation when the charging path 211 is activated.

The oscillator core 103 shown in FIG. 2 is merely exemplary, and other oscillator core circuits are possible. For example, the oscillator core can include a voltage-controlled oscillator, a ring oscillator, an RC circuit, an RLC circuit, a crystal, a clock multiplier, etc. As another example, the charging path 211 and discharging path 214 can include other or different components. Moreover, although bias signals 108A and 108B are shown as voltages, the bias signals 108A and 108B can be currents in other implementations.

Figure 3A:
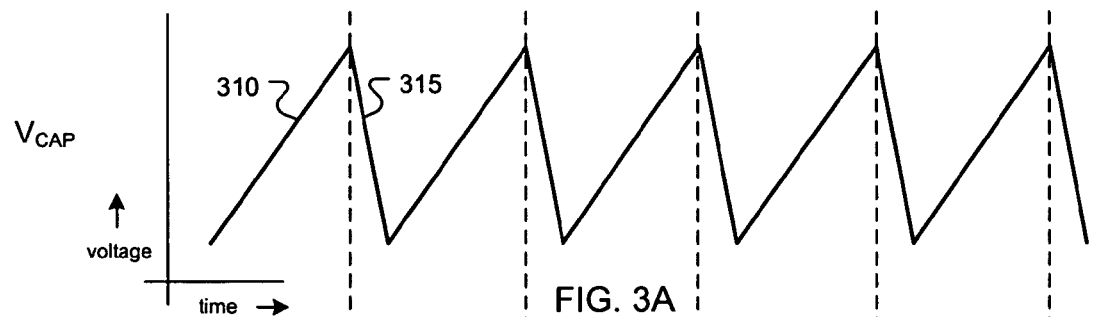
FIGS. 3A-3D provide exemplary voltage-time diagrams corresponding to various voltages that are described with reference to FIG. 2.

FIGS. 3A-3D provide exemplary voltage-time diagrams corresponding to various voltages that are described above with reference to FIG. 2. FIG. 3A provides an exemplary voltage-time diagram of the voltage $V_{CAP}$ signal on the capacitor 206. As shown, the voltage $V_{CAP}$ signal increases during a charging phase 310, and is discharged during a discharge phase 315. In one implementation, as shown, the capacitor 206 is discharged more rapidly than it is charged. To rapidly discharge the capacitor 206, the transistor Q3 can be configured to sink current faster during the discharge phase 315 than the transistors Q1 and Q2 provide the current during the charging phase 305; moreover, the buffer 222 can be configured to turn on transistor Q3 very quickly. Other configurations are possible. For example, in other implementations, the capacitor 206 can be charged and discharged at similar rates. As another example, in other implementations, the capacitor 206 can be charged or discharged in a non-linear manner.

Figure 3B:
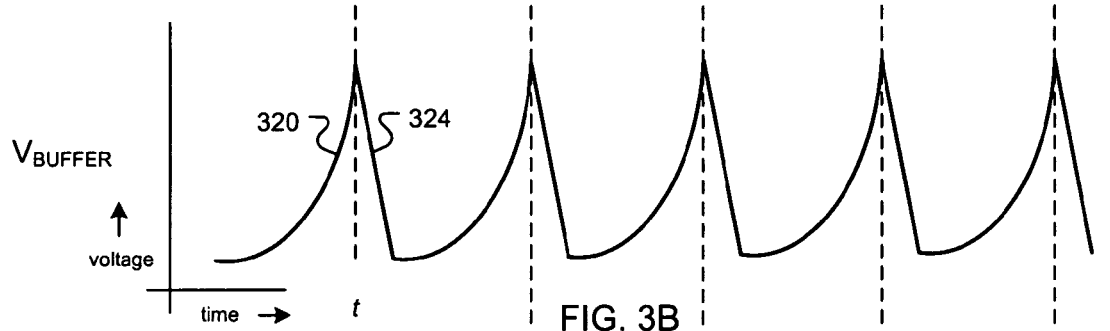

FIG. 3B provides an exemplary voltage-time diagram of the voltage $V_{BUFFER}$ signal at the input of the buffer 222. As shown, the voltage $V_{BUFFER}$ signal increases as the voltage $V_{CAP}$ signal increases. The exact correlation between the voltage $V_{BUFFER}$ and $V_{CAP}$ signals can depend on process parameters of Q1 and Q2 and on the current flowing through Q1 and Q2. As shown, the voltage $V_{BUFFER}$ signal increases during a rising phase 320 and decreases during a falling phase 324. The transition between the rising phase 320 and the falling phase 324 can occur when the voltage $V_{BUFFER}$ signal reaches the input high threshold $V_{IH}$ of the buffer 222 (e.g., at time t), at which point the buffer 222 turns on the transistor Q3, activating the discharge path 218 to initiate the discharge phase of the capacitor 206 and the subsequent falling phase 324 of the voltage $V_{BUFFER}$ signal.

As shown, the voltage $V_{BUFFER}$ signal rises non-linearly during the rising phase 320 and falls substantially linearly during the falling phase 324. In the implementation shown, the exact shape of the non-linear rise can depend on process parameters of the transistors Q1 and Q2 and on the current flowing through the transistors Q1 and Q2. The substantially linear decrease in the voltage $V_{BUFFER}$ signal during the falling phase 324 can result from the short time duration during which the corresponding voltage $V_{CAP}$ signal decreases. In other implementations, the voltage $V_{BUFFER}$ signal can have other shapes, which can also depend on process parameters or current magnitude.

Figure 3C:
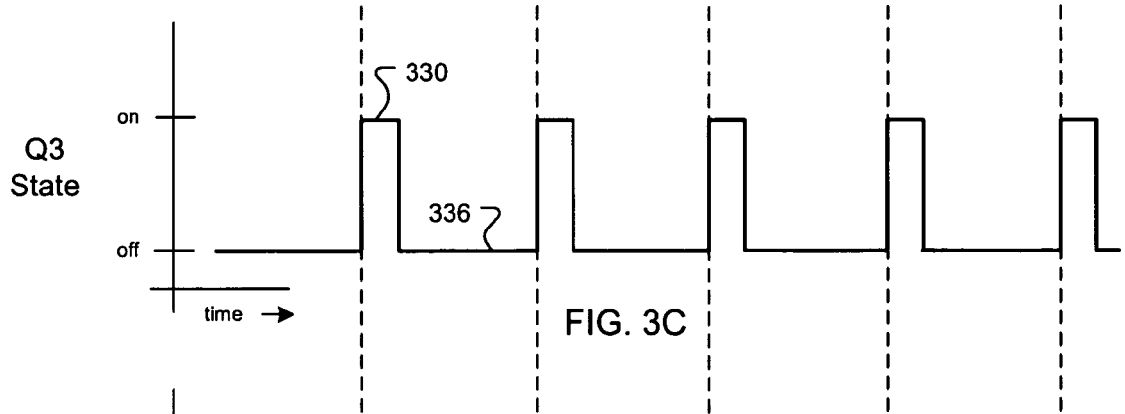

FIG. 3C provides an exemplary voltage-time diagram of the output of the buffer 222, which graphically depicts the state of transistor Q3. As shown, the output of the buffer 222 has a high state 330 and a low state 336, and the high state 330 depicts time during which the transistor Q3 is on and the capacitor 206 is in the discharging phase 315. The high state 330 also represents the time during which the voltage $V_{BUFFER}$ signal is at or above the input high threshold $V_{IH}$ of the buffer, followed by an additional time period during which the buffer changes state.

Figure 3D:
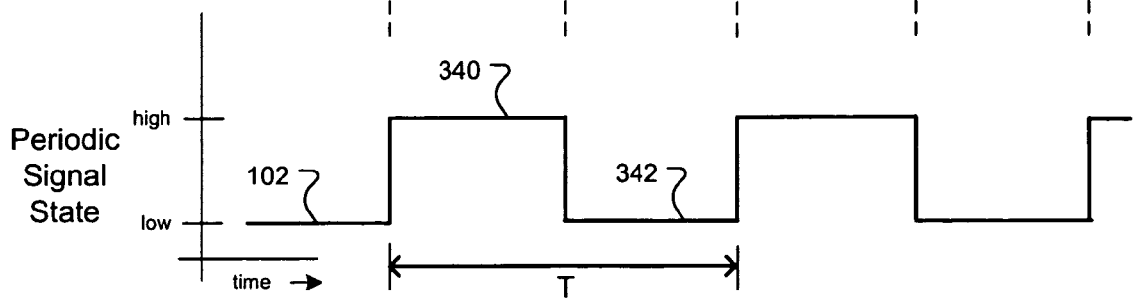

FIG. 3D provides an exemplary voltage-time diagram of the periodic signal 102 (e.g., the output of the flip-flop 230). In one implementation, as shown, the periodic signal 102 has a high phase 340 and a low phase 342. As shown, the output periodic signal 102 has a frequency given by 1/T, and each phase corresponds to one charge/discharge cycle of the capacitor 206. In other implementations, the output periodic signal 102 can have a different duty cycle or can be related to the charging and discharging of the capacitor 206 in a different manner.

Figure 4:
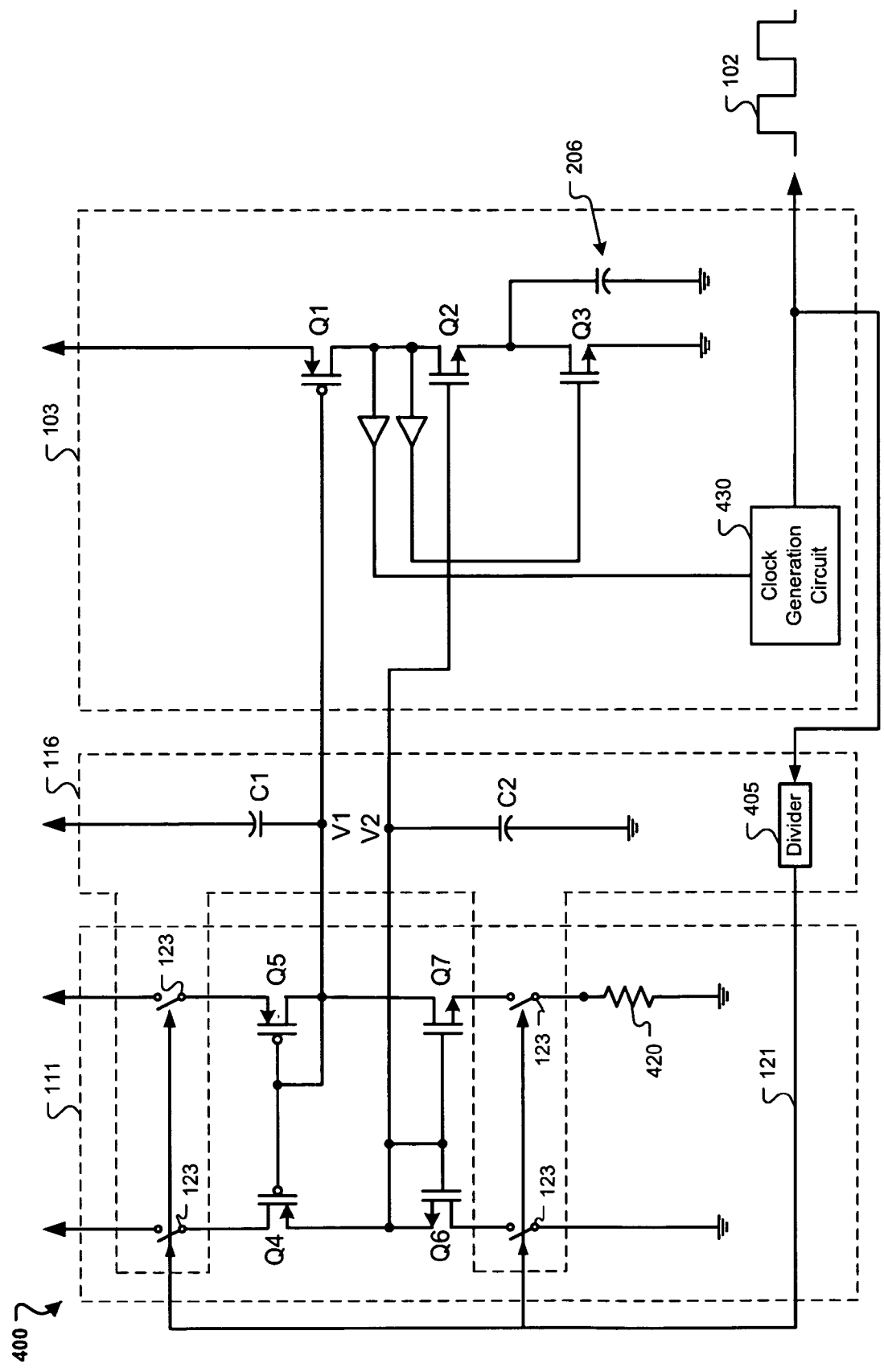
FIG. 4 is a schematic diagram of on exemplary implementation of the circuit that is shown in FIG. 1.

FIG. 4 is a schematic diagram of one implementation 400 of the circuit 100 that is shown in block-diagram format in FIG. 1. As shown, the circuit 400 includes the oscillator core 103 that can generate the periodic signal 102 (shaped by a clock generation circuit 430 (e.g., flip-flop 230)) in response to bias signals 108A and 108B; an active bias portion (e.g., that can include portions of the bias circuit 111) that can provide the bias signals 108A and 108B when powered; and a switching circuit 116 that, as shown, periodically powers the active bias portion and that includes a passive portion (e.g., that can include one or more storage elements, such as the capacitors C1 and C2) that provide the bias signals 108A and 108B when the active portion is not powered. In one implementation, as shown, the passive portion includes a sample-and-hold circuit. The circuit 400 is now described in greater detail.

In one implementation, as shown, the active portion includes a current/voltage source (e.g., transistors Q4, Q5, Q6, Q7, and current-limiting resistor 420). The active portion is powered when the switches 123 are closed. When powered, the transistors Q4, Q5 and Q1 are arranged in a first current mirror configuration, where the current flowing through transistor Q5 is limited by the resistor 420 and by various parameters of the transistors themselves (e.g., channel width and length) and mirrored in transistor Q1. When the switches 123 are closed, the transistors Q6, Q7 and Q2 form a second current mirror. Very little current flows between transistors Q4/Q5 and Q1 when the active portion is powered. Rather, the voltage signals V1, V2, $V_{BUFFER}$ and $V_{CAP}$ largely control the current that flows through Q1 in the oscillator core 103. Similarly, very little current flows between transistors Q6/Q7 and Q2 when the active portion is powered; rather, the same voltage signals (i.e., V1, V2, $V_{BUFFER}$ and $V_{CAP}$ signals) control the current that flows through Q2 in the oscillator core 103. Accordingly, the oscillator core 103 can be biased with the voltage bias signals 108A and 108B (i.e., voltages V1 and V2), and voltages V1 and V2 of the bias signals 108A and 108B can be provided directly by the capacitors C1 and C2. In particular, when the active portion is powered, the capacitors C1 and C2 can be charged (e.g., as part of a sample-and-hold circuit), and the bias signals 108A and 108B can be largely provided by the powered active portion. When the active portion is not powered, energy stored in the capacitors C1 and C2 can provide the bias signals 108A and 108B.

In this arrangement, power is only dissipated in the resistor 420 when the active portion (e.g., bias circuit 111) is powered, but the bias signals 108A and 108B can be provided even when the active portion is not powered. By only periodically powering the active portion, power consumption of the bias circuit 111 can be reduced relative to a circuit that includes a more frequently (e.g., continuously) powered bias circuit.

In some implementations, the capacitors C1 and C2 and the frequency at which the active portion is powered (e.g., the switching frequency) are selected to maintain substantially smooth voltages V1 and V2. For example, for circuits having smaller-capacity capacitors C1 and C2, the switching frequency can be higher, whereas for circuits having larger-capacity capacitors C1 and C2, the switching frequency can be lower.

In one implementation, as shown, the switching frequency is determined by a divider 405 that divides the frequency of the periodic signal 102 to provide the control signal 121 having the switching frequency. For example, the divider 405 can divide the frequency of the periodic signal 102 by in integer (e.g., 8, 16, 32, etc.) to obtain a switching frequency that is an integer fraction of the oscillation frequency. Exemplary plots of the periodic signal 102, the control signal 121 and overall current consumption of the circuit 400 are shown in FIG. 5.

In some implementations, the switches 123 are also transistors. For example, the switches 123 adjacent to transistors Q4 and A5 can be p-MOSFETs (p-channel Metal Oxide Semiconductor Field Effect Transistors), while the switches 123 adjacent to Q6 and Q7 can be n-MOSFETs (n-channel MOSFETs). Moreover, the control signal 121 can include multiple control signals. In particular, in the example above, one control signal can be used to switch on or off the p-MOSFET switches, while another control signal can be used to simultaneously switch on or off the n-MOSFET switches. (E.g., the two control signals can have opposite logical states, such that the switches are either all off or all on.)

Other circuits are possible. For example, bipolar junction transistors (BJTs) can be used in place of MOSFET transistors, and entirely different circuits can be used to provide bias voltage(s) or bias current(s). Moreover, in the implementations shown, each transistor symbol can represent multiple transistors in series. For example, in some implementations, Q4 and Q5 can in fact each be implemented as ten transistors in series, while transistor Q1 can be implemented as a single transistor. In such implementations, because of the current-mirror configuration, the currents flowing through each transistor can be regulated based on the relative number of transistors in each path. In the above example, if other transistor parameters (e.g., channel length and width) are fixed, ten times less current will flow through transistor Q1 than through transistors Q4 and Q5. Transistor channel length and width can also be adjusted to vary relative currents, and the resistor 420 can be selected to limit maximum current through Q5 and Q7 or to select the voltage V1. In some implementations, the control signal 121 can be generated by a circuit other than the divider 405. For example, the control signal 121 can be provided by a crystal device having a frequency that is independent of the frequency of the periodic signal.

Figure 5:
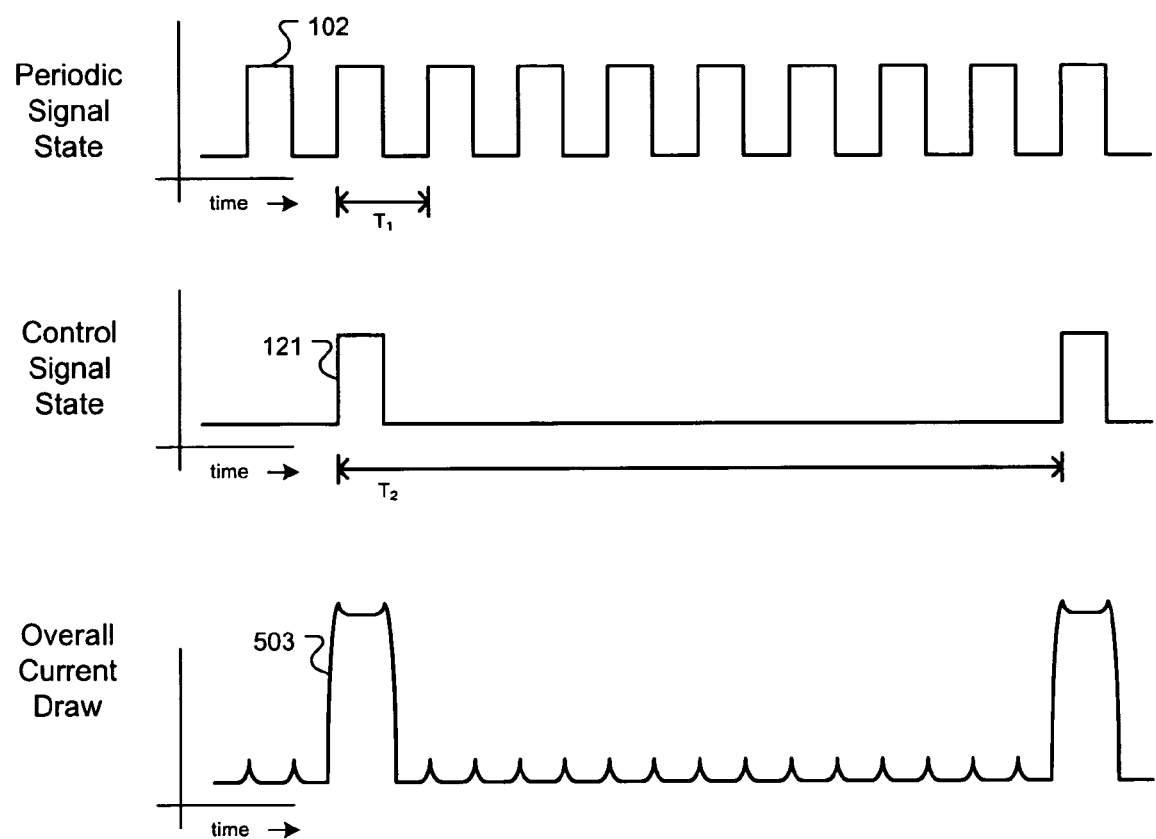
FIG. 5 illustrates exemplary periodic and control signals and an exemplary corresponding current-time plot.

FIG. 5 illustrates the exemplary periodic signal 102 having an oscillation frequency of $1/T_1$, the control signal 121 having a switching frequency of $1/T_2$, and current-time wave form 503 showing corresponding current consumption of the circuit 400 that is shown in FIG. 4. In one implementation, as shown, the switching frequency of the control signal 121 is an integer fraction of the oscillation frequency of the periodic signal 102. Moreover, as shown, the on-time of the control signal 121 can be substantially the same as the on-time of the periodic signal 102. In other implementations (not shown), the duty cycle of the control signal 121 can be larger and can also be independent of the on-time of the periodic signal 102. In some implementations, the duty cycle and switching frequency are selected to minimize, on the one hand, current consumption in the active portion of the circuit 400, and, on the other hand, to substantially smoothly maintain the voltage signals V1 and V2 of the capacitors C1 and C2.

As shown by the current-time plot 503, the circuit 400 draws a small amount of current each time the periodic signal 102 switches state. Also as shown, the circuit 400 periodically draws a larger amount of current each time the control signal 121 is in the high state (e.g., each time the active portion is powered).

As the reader will appreciate, current consumption (and corresponding power consumption) of a device as depicted in FIGS. 4 and 5 can be substantially lower than a device that includes a bias circuit that more consistently draws current to provide one or more bias signals (e.g., a device that includes an always-on bias circuit that is otherwise similar to the bias circuit 111). Such a low-power oscillator circuit can be used in applications where power consumptions is of concern. For example, some systems employ low-power modes, during which system clocks may be powered off and various devices held in a reduced power (e.g., sleep) mode; such systems may require a low-power oscillator to serve as a watchdog timer or sleep clock to allow the system to periodically wake up to check status. As another example, some circuits require very low-power oscillators for other reasons.

A number of implementations have been described. Nevertheless, it will be understood that various modifications may be made without departing from the spirit and scope of the disclosed implementations. For example, various other bias circuits can be used in place of the exemplary circuits described above. Various other oscillator cores can be used in place of the exemplary oscillator core described above, including, for example, voltage-controlled oscillators (VCOs), crystal-based oscillators, ring oscillators, bistable multivibrators, or other circuits capable of generating a periodic output signal. Other storage elements can also be employed. Accordingly, other implementations are within the scope of the following claims.

What is claimed is:

1. A circuit comprising:
    an oscillator core that outputs, in response to a bias signal, a periodic signal having an oscillation frequency;
    a bias circuit that, when powered, provides the bias signal to the oscillator core;
    divider circuit that divides the oscillation frequency of the periodic signal to generate a control signal having a second frequency; and
    a switching circuit that periodically powers the bias circuit at the second frequency, in response to the control signal, and provides the bias signal to the oscillator core when the bias circuit is not powered.

2. The circuit of claim 1, wherein the bias signal is a voltage.

3. The circuit of claim 1, wherein the switching circuit comprises a storage element that stores energy when the bias circuit is powered and uses stored energy to provide the bias signal when the bias circuit is not powered.

4. The circuit of claim 3, further comprising a charging circuit that stores energy in the storage element when the bias circuit is powered.

5. The circuit of claim 3, further comprising a sample-and-hold circuit, wherein the storage element is included in the sample-and-hold circuit.

6. The circuit of claim 1, wherein the second frequency is an integer fraction of the oscillation frequency.

7. The circuit of claim 1, wherein the switching circuit periodically disconnects power to at least a portion of the bias circuit in response to the control signal.

8. The circuit of claim 1, wherein a portion of the bias circuit and a portion of the oscillator core are configured as a current mirror.

9. A method comprising:
- in a first mode, using a first source to provide a bias signal to an oscillator circuit to generate a periodic signal having an oscillation frequency;
- in a second mode, using a second source that is different than the first source to provide the bias signal to the oscillator circuit to generate the periodic signal having the oscillation frequency;
- dividing the oscillation frequency of the periodic signal to generate a control signal having a switching frequency; and
- switching between the first mode and the second mode in response to the control signal, at the switching frequency.

10. The method of claim 9, wherein the first source is a bias circuit.

11. The method of claim 9, wherein the second source is a storage circuit.

12. The method of claim 9, wherein the switching frequency is an integer fraction of the oscillation frequency.

13. The method of claim 10, further comprising disconnecting power to at least a portion of the bias circuit during the second mode.

14. The method of claim 11, further comprising charging the storage circuit during the first mode.

15. A circuit comprising:
- an oscillator core that generates a periodic signal having an oscillation frequency in response to a voltage bias;
- a bias circuit that provides the voltage bias, wherein the bias circuit includes an active bias portion and a passive bias portion that are alternatively activated, the active bias portion including a circuit that draws power from a power supply to provide the voltage bias, the passive bias portion including a storage element, the storage element storing power when the active bias portion is activated and providing the voltage bias when the passive bias portion is activated; and
- a switching circuit that alternatively activates, at a switching frequency that is an integer fraction of the oscillation frequency, the active bias portion and the passive bias portion.

16. The circuit of claim 15, further comprising a divider circuit that divides the oscillation frequency of the periodic signal by an integer to generate a control signal having the switching frequency, wherein the switching circuit employs the control signal to alternatively active the active bias portion and passive bias portion.

17. The circuit of claim 15, wherein the active bias portion draws less power from the power supply when the passive bias portion is activated than when the active bias portion is activated.

* * * * *

UNITED STATES PATENT AND TRADEMARK OFFICE
CERTIFICATE OF CORRECTION

PATENT NO.        : 7,443,260 B2  
APPLICATION NO.   : 11/523463  
DATED             : October 28, 2008  
INVENTOR(S)       : Terje Saether Page 1 of 1

It is certified that error appears in the above-identified patent and that said Letters Patent is hereby corrected as shown below:

Column 8, line 52, Claim 1, before "divider" insert --a--.

Column 10, line 26, Claim 16, delete "active the" and insert --activate the--, therefor.

Signed and Sealed this

Sixth Day of January, 2009

JON W. DUDAS  
*Director of the United States Patent and Trademark Office*